(12) United States Patent
Genna et al.

(10) Patent No.: US 6,489,807 B2
(45) Date of Patent: Dec. 3, 2002

(54) OUTPUT BUFFER AND METHOD OF DRIVING

(75) Inventors: Giovanni Genna, Trapani; Raffaele Solimene, Sorrento, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/925,842

(22) Filed: Aug. 8, 2001

(65) Prior Publication Data

US 2002/0105356 A1 Aug. 8, 2002

(30) Foreign Application Priority Data

Aug. 10, 2000 (IT) .................. VA2000A000027

(51) Int. Cl.[7] .................. H03K 19/00; H03K 19/02; H03K 5/12
(52) U.S. Cl. .................. 326/56; 326/27; 326/57; 326/83; 327/170
(58) Field of Search .................. 326/56, 57, 58, 326/26, 27, 29, 82, 83; 327/170, 374, 379

(56) References Cited

U.S. PATENT DOCUMENTS 5,852,579 A * 12/1998 Arcoleo et al. ........ 365/189.05

* cited by examiner

*Primary Examiner*—Daniel D. Chang
(74) *Attorney, Agent, or Firm*—Lisa K. Jorgenson; Allen, Dyer, Doppelt, Milbrath & Gilchrist, P.A.

(57) ABSTRACT

A method is for driving an output buffer for outputting a datum of a certain voltage level with a certain slew-rate as a function of an input datum and a first enabling signal. The first enabling signal commands the buffer to a normal functioning state or to a high impedance state. The output buffer has an output stage controlled at least by a pull-up driving circuit and a pull-down driving circuit, and an enabling circuit input with the input datum and a second enabling signal and generating control signals. The control signals may be in phase or in phase opposition depending on whether the second enabling signal is active or disabled, and they are input into the respective driving circuits.

37 Claims, 8 Drawing Sheets

TRANSITION 1 → 0

US 6,489,807 B2

OUTPUT BUFFER AND METHOD OF DRIVING

FIELD OF THE INVENTION

The present invention relates to electronic circuits, and, more particularly, to output buffers such as integrated output buffers with slew-rate regulation.

BACKGROUND OF THE INVENTION

Output buffers are used in many devices for producing an output signal with a desired slew-rate at a certain time and with a certain output voltage-current characteristic. They essentially include a pull-up device and a pull-down device driven by a circuit, and they output a datum with a certain slew-rate and voltage level characteristic when an externally generated enabling signal is active.

A basic diagram of an output buffer is shown in FIG. 3, where an input datum DATO is output (DQ_PAD) with a desired voltage and slew-rate if an enabling signal EN is active. The control circuit (FIG. 4) substantially includes a logic circuit that turns on or forces the buffer into a high impedance state by producing two pull-up and pull down control signals P and N for the pull-up and pull down driving circuits, respectively.

A simple embodiment of the tristate circuit for placing the buffer in a high impedance state is illustrated in FIG. 5. The circuit produces a pair of control signals P and N both equal to the inverted logic signal of the input signal DATO if the enabling signal EN is active or different from each other. This is done independently of the value of the input signal DATO.

Such circuits, the basic diagram of which is shown in FIG. 6, produce driving signals PGATE and NGATE that switch with a certain variable speed to regulate the slew-rate of the final stage as desired. The slew-rate of the output DQ_PAD depends in general on the load and on the charge/discharge current, which depends upon the size of the transistor of the final stage and from the gate-source voltage applied to the transistors thereof. The slew-rate may be regulated by regulating the gate-source voltage. This is because the load is generally constant and the sizes of the transistors of the final stage are established to have a desired output voltage-current characteristic.

For better comprehension of the technical problem being addressed, a case in which the output of the final stage switches from high to low will now be considered. On the pull-up transistors a voltage PGATE is applied that rapidly reaches the supply value, as illustrated in FIG. 7, and remains at this value indefinitely while the voltage NGATE increases with a certain slope.

The pull-up transistor is immediately turned off while the pull-down transistor turns on slowly. This is so that the output voltage remains at a high value minus a small voltage drop due to the below-threshold current for as long as the pull-down does not leave the below-threshold region.

After a time interval TON (turn-on time) has elapsed, the voltage NGATE overcomes the threshold voltage VTN and the output voltage drops more rapidly. In this phase the output capacitance discharges through a pull-down transistor, as illustrated in FIG. 8, but in a time that depends on the current I flowing therethrough. For this reason, the faster the switching of the signal NGATE is, the faster the current I increases. Thus, the greater the slew-rate of the output DQ_PAD will be and the shorter the response time T_val. With such prior art buffers it is not possible to produce an output datum with a relatively small slew-rate in relatively short response times.

Generally, the buffer should be able to function in different modes depending on the environment in which it works, both in terms of the voltage-current characteristic (e.g., the allowed functioning zones of the voltage-current characteristic for both transitions are shown in FIG. 1, for the case of a PCI 3.3V environment) as well as in terms of output slew-rate (e.g., in a PCI environment the slew-rate must be smaller than that normally required in a TTL environment). The pull-up graph of FIG. 1 corresponds to the equation $I_{oh}+(98.0/V_{cc})*(V_{out}-V_{cc})*(V_{out}+0.4V_{cc})$, where $V_{cc}>V_{out}>0.7V_{cc}$, and the pull down graph of FIG. 1 corresponds to the equation $I_{ol}=(256/V_{cc}*V_{out})*(V_{cc}-V_{out})$, where $0_V<V_{out}<0.18V_{cc}$.

Typical values of the slew-rate for a PCI environment under standard load conditions and defined by the specifications are indicated in the following table:

TABLE 1

| Parameter | Condition | Min ÷ Max |
| --- | --- | --- |
| Slew-rate of the raising edge | 0.2 Vcc ÷ 0.6 Vcc load | 1 ÷ 4 V/ns |
| Slew-rate of the falling edge | 0.2 Vcc ÷ 0.6 Vcc load | 1 ÷ 4 V/ns |

To make the slew-rate of the output compatible with a PCI or TTL environment, the buffer may be designed in a way such that the slew-rate is always equal to the minimum that is ever required. Unfortunately, despite its simplicity, this approach is not convenient because it unduly increases the response time T_VAL of the buffer.

Referring to FIG. 2, the response time T_VAL is the time that elapses from the edge of the clock signal CLK, which determines the instant in which the input datum DATO is read, to the edge of the output DQ_PAD. The response time of prior art buffers is generally the sum of the delay introduced by the logic circuits that form the buffer, of the turn-on time TON of the pull-up or pull-down transistor, and of the time required by the output DQ_PAD for switching from one value to another value with a certain slew-rate.

Because the delay caused by the logic circuits is constant, with the circuit of FIG. 3 the build-up time T_VAL may be reduced only by increasing the speed of variation of the signal that drives the transistor to be turned on. Consequently, a transition of the output DQ_PAD with a slew-rate that may be excessively large for a PCI environment must be determined.

There is a need for an output buffer capable of producing an output datum with a relatively small slew-rate while ensuring an acceptable fast response. Moreover, it would be highly desirable to have an output buffer producing a datum in a certain mode of operation with a slew-rate that may be adjusted at least between two different values, though with response times practically equal or even shorter than the response times of comparable known buffers.

SUMMARY OF THE INVENTION

It is an object of the invention to provide a method of driving an output buffer that provides shorter response times than those of prior art buffers with comparable slew-rates.

Another object of the invention is a to provide a method of driving an output buffer that improves response time.

A further object of the invention is to provide an output buffer capable of outputting a datum with a reduced slew-rate and without penalizing the response time.

In contrast to prior art buffers, according to the present invention the slew-rate is controlled by regulating the turn-off and not the turn-on of the pull-up or the pull-down transistors. Considering, for example, a transition from the high state to the low state of the output DQ_PAD, instead of immediately turning off the pull-up transistor and slowly turning on the pull-down transistor, the opposite is done. That is, the pull-down transistor is turned on quickly and the pull-up transistor is turned off slowly.

This approach, despite the increase of power consumption due to the temporary short-circuiting of the supply in the output stage, reduces the time of response for the same slew-rate. This is because T_VAL is no longer limited by the turn-on time TON. The increment of power absorption, due to the short-circuiting of the supply, remains within an acceptable range.

Moreover, it has been observed that the slew-rate of the output switchings may be less sensitive to temperature variations than in prior art buffers because both transistors are turned on during the output switchings. Indeed, temperature variations influence in an opposite manner the pull-up and the pull-down transistors. This is because the output is switched when both transistors are in a conduction state. Thus, the slew-rate becomes less dependent upon temperature.

By having a buffer that may have a faster response than known buffers with the same slew-rate, or a reduced slew-rate with the same response time, it is possible to implement, with few modifications, output buffers with different modes of operation. For example, buffers with a slew-rate that may be set at at least two different values, and a response time equal to or faster than that of comparable prior art buffers of similar fabrication technology may be implemented.

According to one embodiment of the invention, an IC selection signal of the functioning mode, which is applied to the tristate circuit, allows for the selection between at least two different modes of operation of the driving circuits of the pull-up and the pull-down transistors. This determines the switching of the buffer output with one or another slew-rate.

BRIEF DESCRIPTION OF THE DRAWINGS

The various aspects and advantages of the invention will become even more apparent through a description of several embodiment of the invention, with reference to the attached drawings, wherein.

DETAILED DESCRIPTION OF THE PREFERRED EMBODIMENTS

The method of the invention includes regulating the slew-rate during a high-low (low-high) transition by controlling the turning-off of the pull-up (pull-down) transistor, instead of the turning-on of the pull-down (pull-up) transistor. In this way, the build-up time T_VAL is reduced in a non-negligible way because it is no longer necessary to wait the turn-on time of the pull-up or the pull-down transistor to switch the output.

When the buffer switches from a tristate condition to normal functioning, it is necessary to drive the turning-on of the pull-up as well as of the pull-down transistors, as it happens in common output buffers. However, in this case the response time T_VAL is relatively short, even though it includes the turn-on time, because it does not include the signal propagation delays of the logic circuits of the buffer. In fact, in this case, the logic circuits have already produced the input datum before activating the output buffer enabling signal.

As already noted, another feature of the buffer of the invention is that it may function in at least two different modes. That is, outputting an output datum with a relatively reduced slew-rate to meet the requirement of PCI and TTL environments, without penalizing the response time T_VAL.

Figure 1:
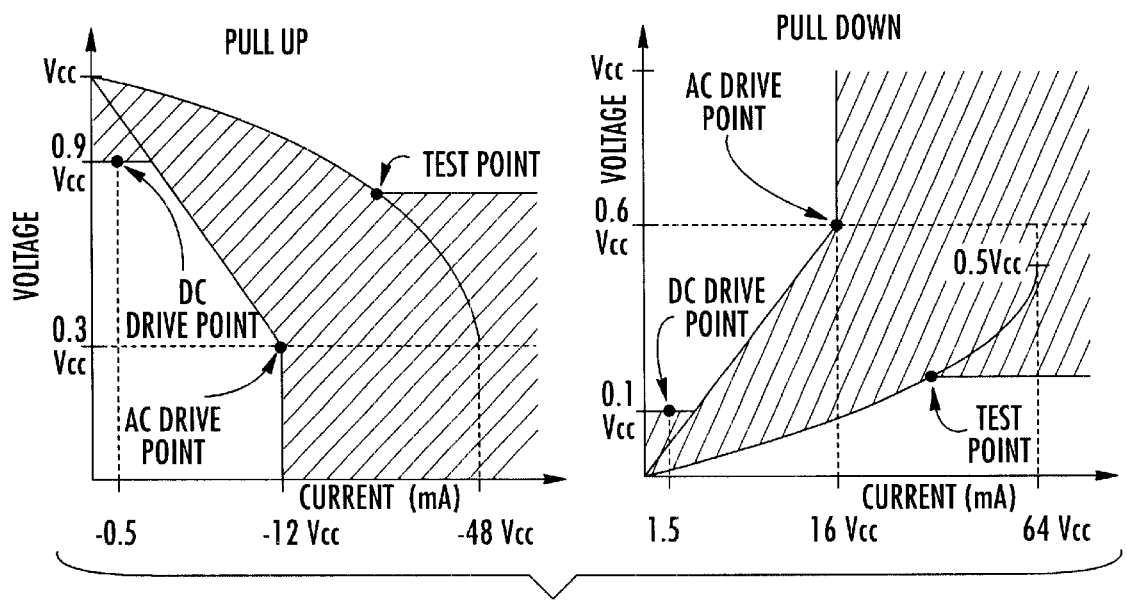
FIG. 1 is a graph illustrating the valid zone of operation of the output voltage-current characteristic in a PCI 3.3V environment according to the prior art.
Figure 2:
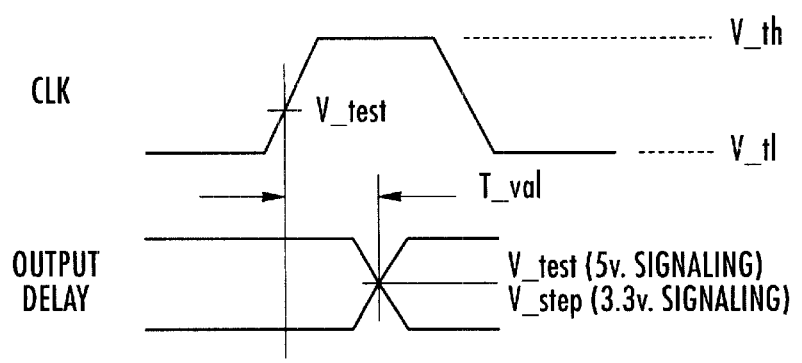
FIG. 2 is a timing diagram of the succession of an edge of the clock signal and the output edge according to the prior art.
Figure 3:
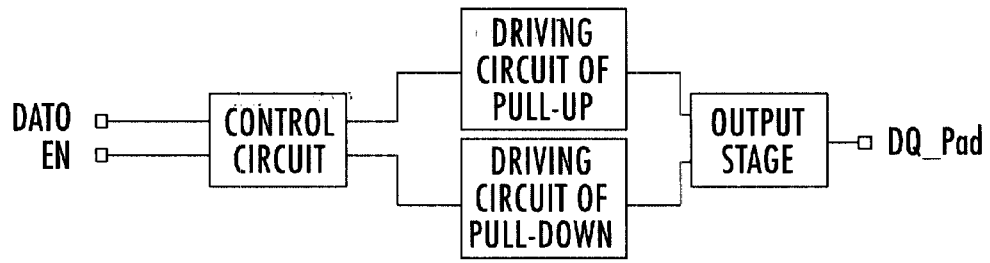
FIG. 3 is a schematic block diagram of an output buffer according to the prior art.
Figure 4:
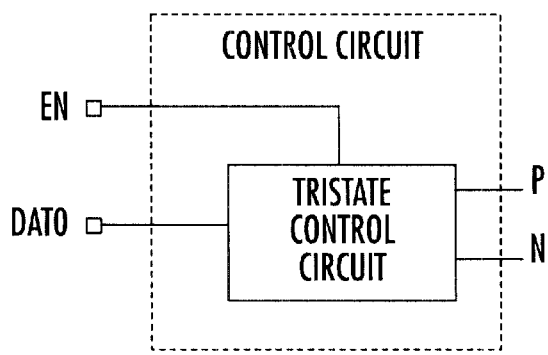
FIG. 4 is a schematic block diagram of the control circuit of the output buffer of FIG. 3.
Figure 5:
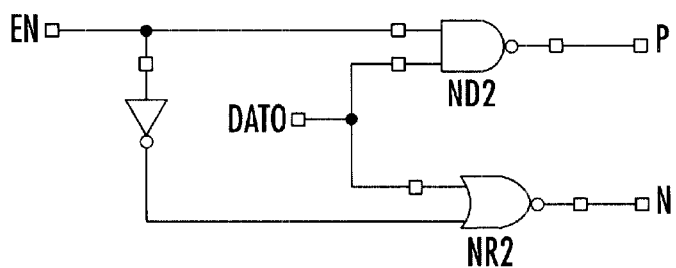
FIG. 5 is schematic diagram of a possible hardware embodiment of the tristate circuit of FIG. 4.
Figure 6:
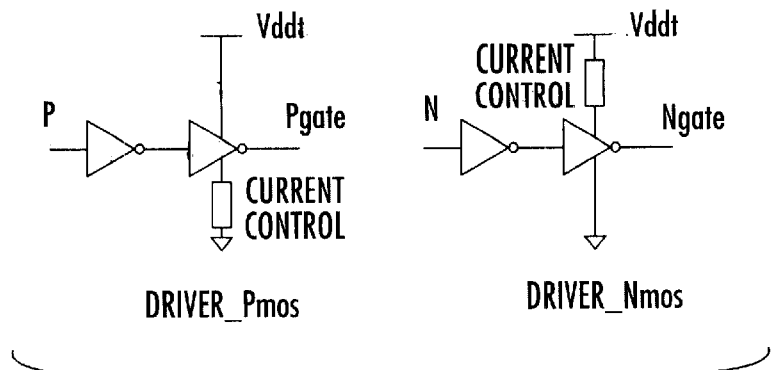
FIG. 6 is a schematic diagram of prior art embodiments for driving circuits for the pull-up and the pull-down transistors.
Figure 7:
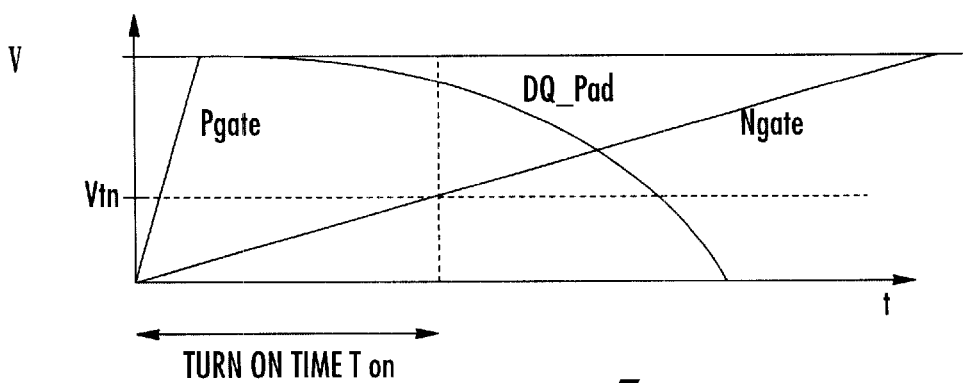
FIG. 7 is a diagram of the driving and of the output signals of a buffer made according to the diagram of FIG. 3.
Figure 8:
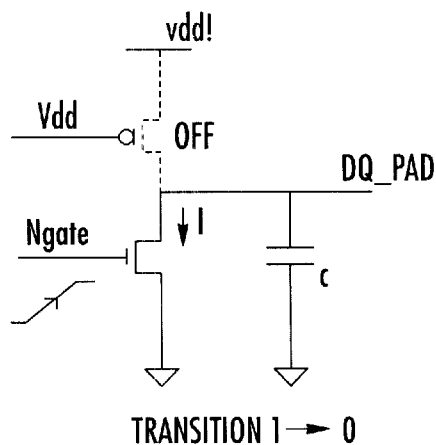
FIG. 8 is a schematic diagram of the output stage of a prior art buffer illustratively shown during switching from high to low.
Figure 9:
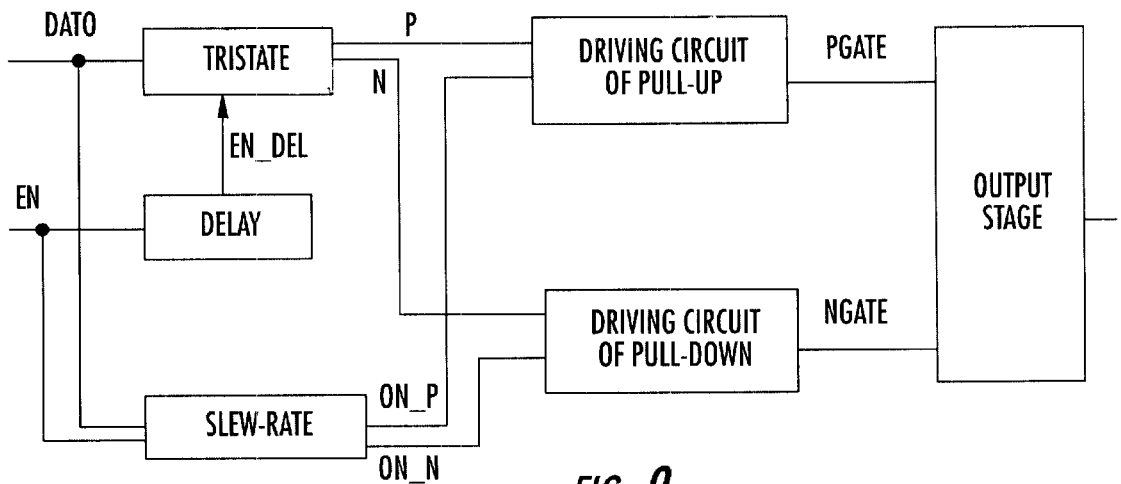
FIG. 9 is a schematic block diagram of the buffer according to the present invention.

It is not sufficient to drive the turning-off of the pull-up and pull-down transistors for switching the output with a desired slew-rate. In fact, the transistors of the output stage are in an off state when switching from tristate to normal functioning. A circuit that regulates the turning on of the transistors of the output stage with a pre-established dynamic, according to the invention, is shown in FIG. 9.

As with the prior output buffers, the buffer of the invention may also have a tristate circuit receiving the input datum DATO and a disabling signal EN_DEL. It may further have a pair of pull-up and pull-down driving circuits for the output stage. One advantageous feature of the circuit of FIG. 9 is that it includes a slew-rate control circuit for the first switching from a tristate condition that produces regulation signals for turning on the pull-up (ON_P) and the pull-down (ON_N).

These signals are input into the respective driving circuits as a function of the datum to be output DATO and of an enabling signal EN. The signal EN_DEL is a delayed replica of the signal EN, thus the regulation signals ON_P and ON_N, when resuming normal operation from tristate, are output ahead of the control signals P and N. In this way the drive signals PGATE and NGATE will be generated with the desired dynamic before the new control signal is received.

The driving circuits of the pull-up and of the pull-down transistors are essentially NOR and NAND logic gates, respectively, input with the inverted logic signal of the respective control signal (P, N) and with the respective regulation signal (ON_P, ON_N). According to one aspect of this invention, the nodes of these gates on which the respective regulation signals are present drive transistors that are more resistive than transistors driven by the other nodes.

When resuming operation from tristate, the respective regulation signal varies, while the control signals P and N are still at the values assumed during the tristate phase because EN_DEL is still disabled. Therefore, PGATE and NGATE correspond to the inverted logic signals of ON_P and ON_N, respectively. The speed of the variation (i.e. the dynamic) of the driving signals (PGATE, NGATE) may be established by sizing the transistors driven by the input of the logic gates on which the regulation signal is applied to be more or less resistive.

Figure 14:
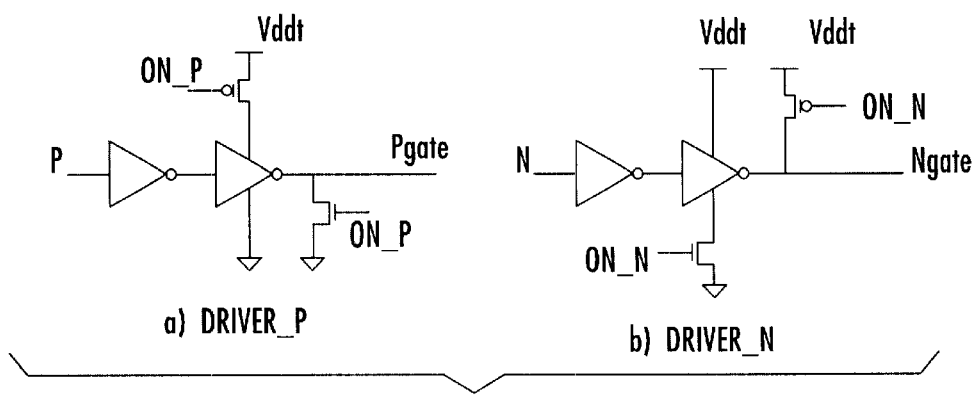
FIG. 14 is a schematic diagram of the circuit blocks DRIVER_P and DRIVER_N of FIG. 13.

The pull-up and pull-down driving circuits for the transistors of the output stage of the buffer may be implemented as shown in FIG. 14, in a manner that will be understood by those of skill in the art. For better illustrating the functioning of the buffer of the invention, the case in which a transition from high to low of the output DQ_PAD of the buffer must be produced will not be considered.

Figure 15:
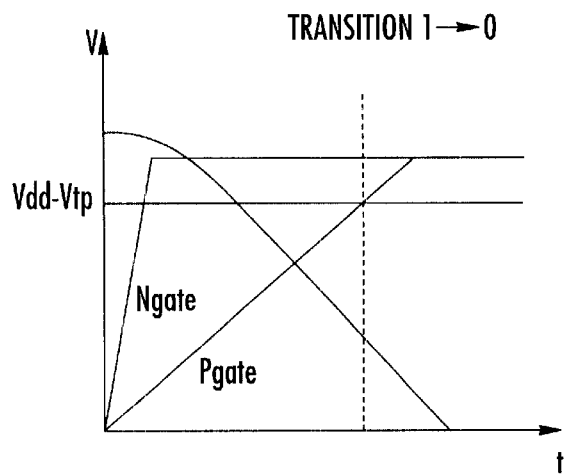
FIG. 15 is a diagram of the driving signals of the output buffer of the invention during a transition from high to low.
Figure 16:
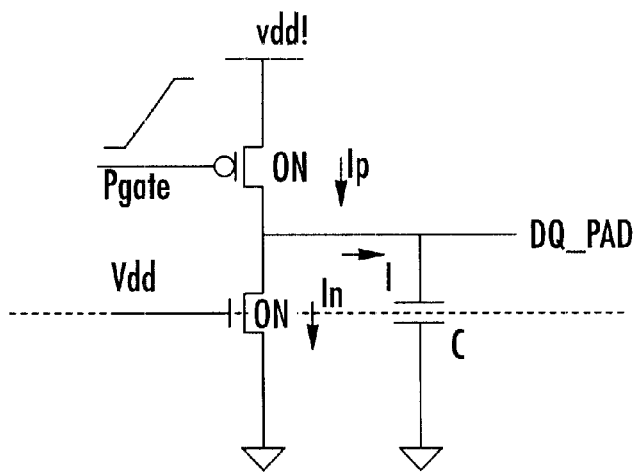
FIG. 16 is a schematic diagram of the output stage of the buffer of the invention during a transition from high to low.

As illustrated in FIG. 15, the signal NGATE switches quickly to its active value, turning on the pull-down transistor, while the signal PGATE raises relatively more slowly. Thus, the current circulating in the pull-up transistor is slowly reduced and eventually turns off. The output capacitance discharges with a current I that is the difference between the current $I_p$ provided by the pull-up transistor and the current $I_n$ drained by the pull-down transistor, as illustratively shown in FIG. 16. The speed of variation of the current $I_p$ determines the slew-rate of the output.

Figure 17:
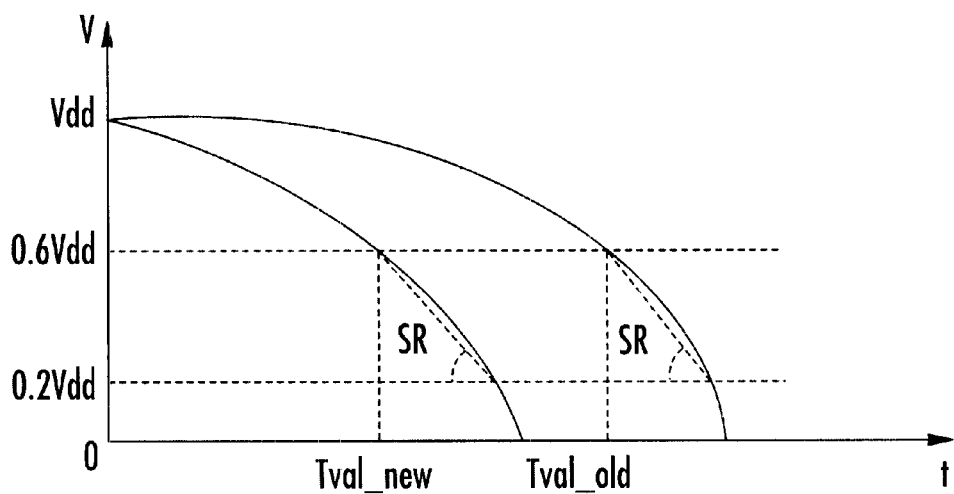
FIG. 17 is a diagram comparing output transition characteristics of the buffer of the invention and of a prior art buffer with the same slew-rate.
Figure 18:
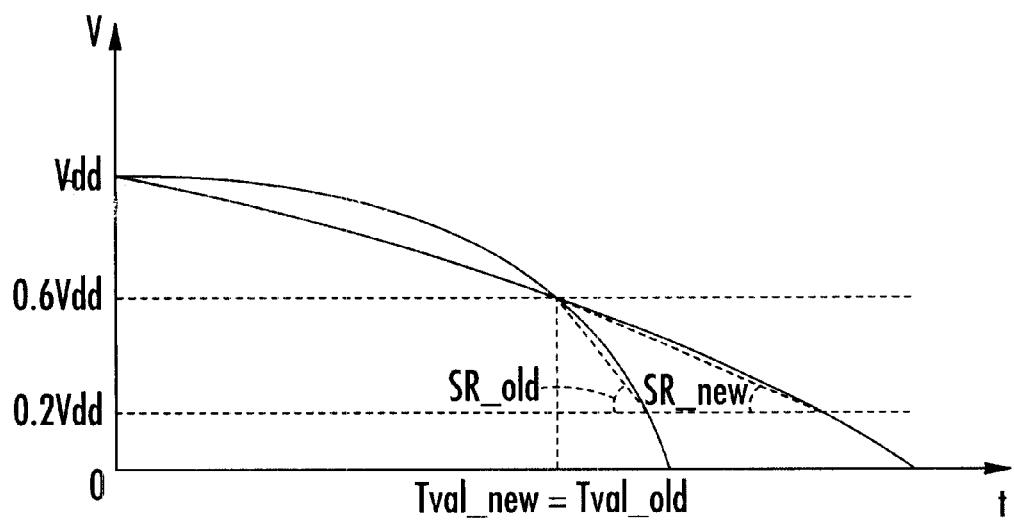
FIG. 18 is a diagram comparing output transition characteristics of the buffer of the invention and of a prior art buffer with the same response time.

In practice, the buffer of the invention has a response time T_VAL_NEW noticeably smaller than the response time T_VAL_OLD of a comparable prior art buffer with the same slew-rate, or vice-versa, as shown in FIGS. 17 and 18. This is because it is no longer necessary to wait for the turn-on time TON of the transistors of the output stage.

Because the slew-rate of the buffer of the invention may be reduced without significantly penalizing the response time, it is possible to realize an output buffer whose functioning characteristics are selectable between a first mode with a relatively high slew-rate and short response time that may be suitable in a TTL environment, and a second mode with a relatively low slew-rate and longer response time that may be most suitable in a PCI environment. To this end, a selection signal IC may be input into the buffer to make the control circuit of the slew-rate produce regulation signals ON_P and ON_N according to the selected mode.

Figure 12:
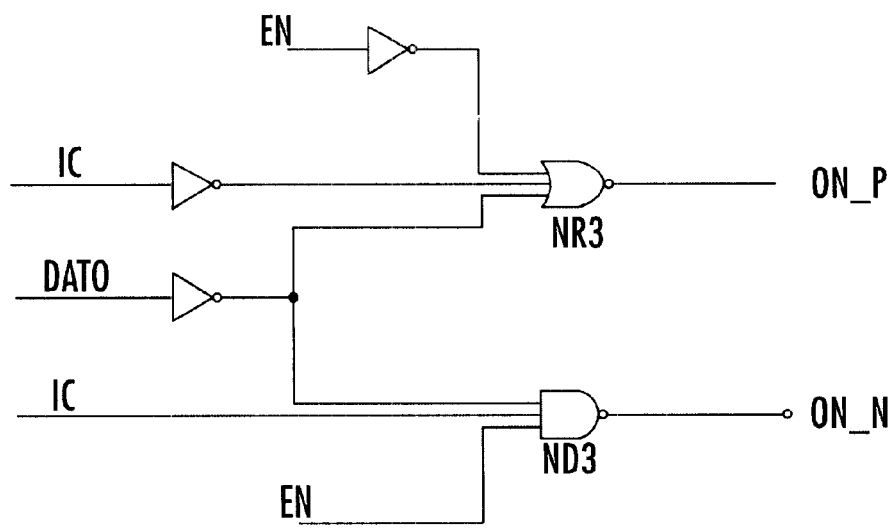
FIG. 12 is a schematic diagram of the slew-rate control circuit of FIG. 10.

By way of a example, the particular case in which the buffer must function in either PCI or TTL logic based upon whether the signal IC is active or disabled will now be considered. A simple embodiment of the slew-rate control circuit is illustrated in FIG. 12, as will be understood by those of skill in the art. It is worth noting that if the signal IC is not active, i.e., the PCI functioning mode is not selected, the control circuit of the slew-rate is practically disabled because it is convenient to have a large slew-rate with a short response time.

Figure 19:
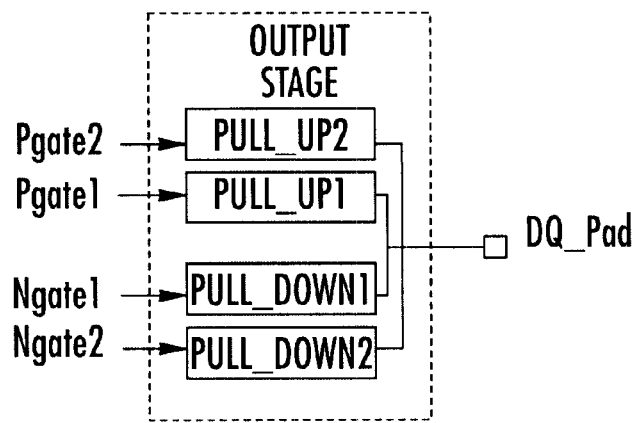
FIG. 19 is a schematic block diagram of an embodiment of the output stage of the buffer of the invention.

According to one embodiment of the invention, the output stage may be dimensionally split, as shown in FIG. 19, by using a pair of pull-up transistors and a pair of pull-down transistors (FINALE1, FINALE2). In this way, the output stage has effective sizes of the transistors that, when using both transistors of each pair, satisfy the specifications of a PCI environment, yet while using only one transistor of each pair the sizes satisfy the more relaxed specifications of a TTL environment.

Figure 10:
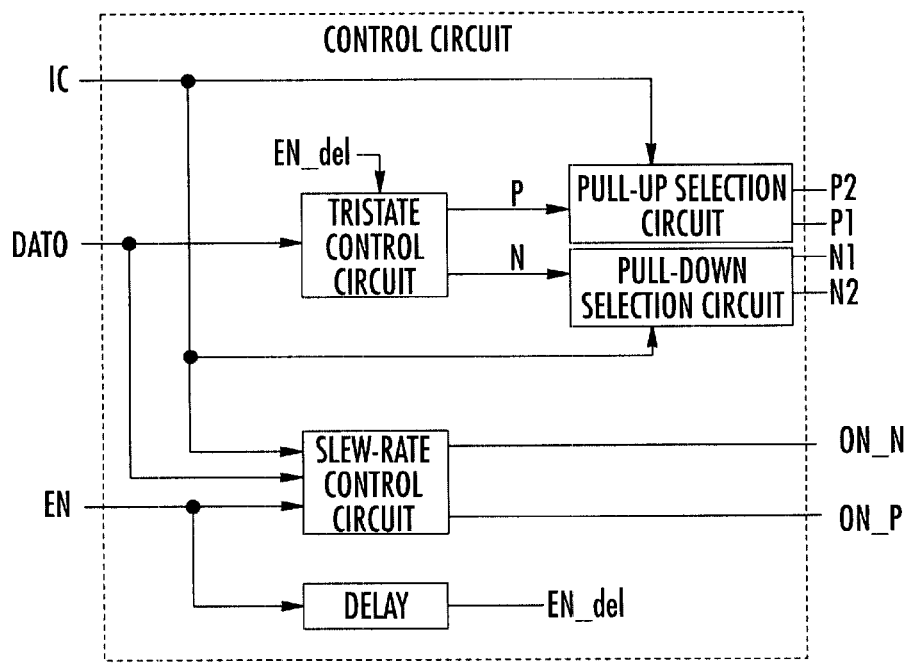
FIG. 10 is a schematic block diagram of an embodiment of the control circuit of the buffer of the invention.

For driving the output stage, the necessary control signals are generated, for example, by using the circuit of FIG. 10. It will be observed that the tristate circuit produces the signals P and N for the respective logic circuits, indicated in FIG. 10 as the pull-up and pull-down selection circuits that produce first and second pull-up and pull-down control signals P1, N1 and P2, N2, respectively.

Figure 11:
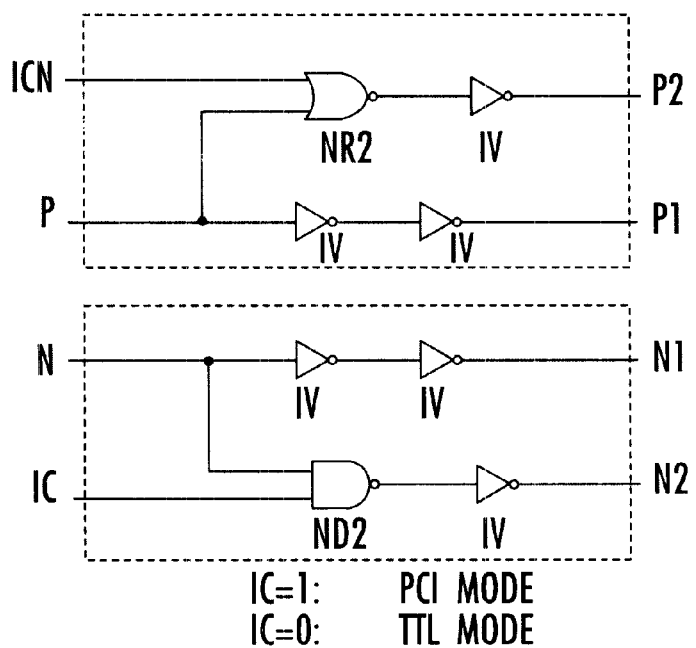
FIG. 11 is schematic diagram of an embodiment of the pull-up and the pull-down logic circuits according to the invention.

The first control signals P1 and N1 are used for controlling the functioning of the pull-up and pull-down transistor pair that must function in PCI as well as TTL environments. The second control signals P2 and N2 are used to control the functioning of the pull-up and pull-down transistor pair that must remain inactive in a TTL environment. These logic circuits, one embodiment of which is depicted in FIG. 11, produce the pair of signals P2 and N2 by ORing the signal P and the inverted logic signal of the selection input IC and by ANDing N and IC, respectively. The pair of signals P1 and N1 are replicas of the respective control signals P and N suitably delayed by the two-inverter chain to be output simultaneously with the other pair of signals P2 and N2.

Figure 13:
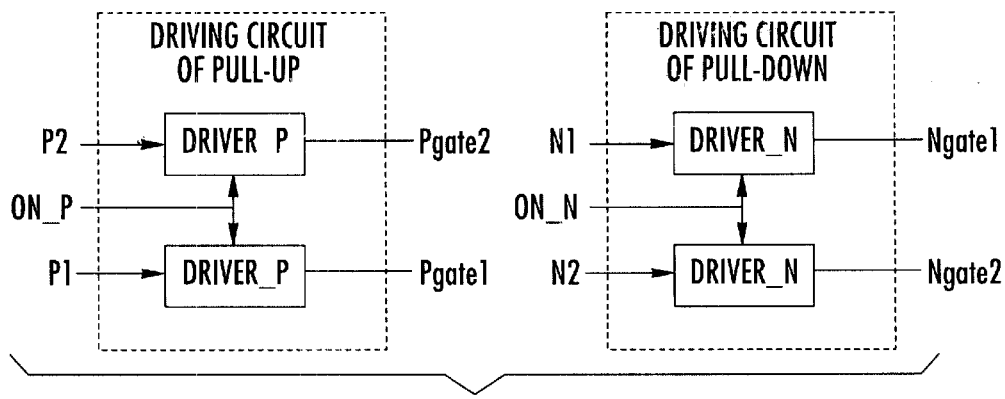
FIG. 13 is a schematic block diagram of the pull-up and the pull-down driving circuits of the invention.

The pull-up and pull-down driving circuits are also doubled, as illustrated in FIG. 13, to separately control the functioning of the two pairs of pull-up and pull-down transistors of the output stage. Of course, it is also possible for both output transistor pairs to work irrespectively of the logic environment. Yet, in this case the output stage would be over-dimensioned when functioning in TTL mode, with consequent drawbacks of greater noise and power dissipation.

The buffer of the invention switches its output with a slew-rate that is less dependent upon temperature and supply voltage than prior art buffers, as may be readily observed by comparing the data in Table 2, below:

TABLE 2

| Working Conditions | Slew-rate (prior art) | Slew-rate (invention) | T_VAL (prior art) | T_VAL (invention) |
| --- | --- | --- | --- | --- |
| 3 V; 85° C. | 1.75 V/ns | 1.4 V/ns | 14.4 ns | 8.2 ns |
| 3.3 V; 27° C. | 3.0 V/ns | 2.0 V/ns | 10.5 ns | 6.5 ns |
| 3.6 V; 0° C. | 4.1 V/ns | 2.7 V/ns | 8.3 ns | 5.4 ns |

These results may be explained by considering that temperature and voltage variations induce on the pull-up and the pull-down opposite effects that, to some extent, balance one another. This is because in the buffer of the invention both the pull-up and the pull-down are in conduction state when That which is claimed is:

1. An output buffer for outputting an output datum having a predetermined voltage level and predetermined slew-rate as a function of an input datum and a first enabling signal that causes the output buffer to operate in a normal state or a high impedance state, the output buffer comprising:

an output stage comprising at least one pull-up transistor and at least one pull-down transistor;

an enabling circuit receiving as inputs the input datum and a second enabling signal and generating a pull-up control signal and a pull-down control signal either in phase or in phase opposition based upon whether the second enabling signal is active or disabled, the second enabling signal being a delayed replica of the first enabling signal;

a slew-rate regulation circuit for producing a pull-up slew rate regulation signal and a pull-down slew rate regulation signal based upon the first enabling signal and the input datum;

at least one pull-up driving circuit for driving said at least one pull-up transistor based upon the pull-up control signal, said at least one pull-up driving circuit comprising at least one NOR logic gate having first and second inputs, the first input of said NOR logic gate receiving an inverted pull-up control signal and the second input of said NOR logic gate receiving the pull-up slew-rate regulation signal, the second input of said NOR logic gate having a greater resistance than a resistance of the first input of said NOR logic gate; and at least one pull-down driving circuit for driving said at least one pull-down transistor based upon the pull-down control signal, said at least one pull-down driving circuit comprising at least one NAND logic gate having first and second inputs, the first input of said NAND logic gate receiving an inverted pull-down control signal and the second input of said NAND logic gate receiving the pull-down slew-rate regulation signal, the first input of said NAND logic gate having a greater resistance than a resistance of the second input of said NAND logic gate.

2. The output buffer of claim 1 wherein said slew rate regulation circuit produces the pull-up slew-rate regulation signal by ANDing the first enabling signal and the input datum.

3. The output buffer of claim 1 wherein said slew rate regulation circuit produces the pull-down slew-rate regulation signal by NANDing the first enabling signal and an inverted input datum.

4. The output buffer of claim 1 wherein said slew-rate regulation circuit further receives a mode selection signal for selecting between one of two different slew-rate values.

5. The output buffer of claim 4 wherein said slew-rate regulation circuit ANDs the first enabling signal, the input datum, and the mode selection signal to produce the pull-up slew rate regulation signal.

6. The output buffer of claim 5 wherein said slew-rate regulation circuit NANDs the first enabling input, an inverted input datum, and the mode selection signal to produce the pull-down slew-rate regulation signal.

7. The output buffer of claim 4 wherein the pull-up control signal comprises a first pull-up control signal; and wherein said output buffer further comprises a pull-up logic circuit for providing a second pull-up control signal as a delayed replica of the first pull-up control signal and a third pull-up control signal by ORing the first pull-up control signal and an inverted mode selection signal.

8. The output buffer of claim 7 wherein said at least one pull-up driving circuit comprises:

a first pull-up driving circuit receiving the pull-up slew-rate regulation signal and the second pull-up control signal and producing a first pull-up driving signal; and a second pull-up driving circuit receiving the pull-up slew-rate regulation signal and the third pull-up control signal and producing a second pull-up driving signal.

9. The output buffer of claim 8 wherein the output stage comprises a pull-up stage controlled by the first and second pull-up driving signals.

10. The output buffer of claim 4 wherein the pull-down signal comprises a first pull-down control signal; and wherein said output buffer further comprises a pull-down logic circuit for providing a second pull-down control signal as a delayed replica of the first pull-down control signal and a third pull-down control signal by ANDing the first pull-down control signal and the mode selection signal.

11. The output buffer of claim 10 wherein said at least one pull-down driving circuit comprises:

a first pull-down driving circuit receiving the pull-down slew-rate regulation signal and the second pull-down control signal and producing a first pull-down driving signal; and a second pull-down driving signal receiving the pull-down slew rate regulation signal and the third pull-down control signal and producing a second pull-down driving signal.

12. The output buffer of claim 11 wherein said output stage comprises a pull-down stage controlled by the first and second pull-down driving signals.

13. The output buffer according to claim 1 wherein said at least one pull-up driving circuit comprises:

a cascade of an even number of inverters comprising an output inverter;

an NMOS transistor connected between an output node of said at least one pull-up driving circuit and a reference voltage; and a PMOS transistor connecting said output inverter to a supply voltage, said PMOS transistor having a greater resistance than a resistance of said NMOS transistor, and both of said NMOS and PMOS transistors being controlled by the pull-up slew-rate regulation signal.

14. The output buffer according to claim 1 wherein the at least one pull-down driving circuit comprises:

a cascade of an even number of inverters comprising an output inverter;

a PMOS transistor connected between an output node of said at least one pull-down driving circuit and a supply voltage; and an NMOS transistor connecting said output inverter to a reference voltage, said NMOS transistor having a greater resistance than a resistance of said PMOS transistor, and both of said NMOS and PMOS transistors being controlled by said pull-down slew-rate regulation signal.

15. The output buffer of claim 1 wherein said enabling circuit produces the pull-up control signal by NANDing the second enabling signal and the input datum and produces the pull-down control signal by NORing an inverted second enabling signal and the input datum.

16. An output buffer for outputting an output datum having a predetermined voltage level and predetermined slew-rate comprising:
- an output stage comprising at least one pull-up transistor and at least one pull-down transistor;
- a slew-rate regulation circuit for producing a pull-up slew rate regulation signal and a pull-down slew rate regulation signal based upon a first enabling signal and an input datum, the first enabling signal for causing the output buffer to operate in a normal state or a high impedance state;
- an enabling circuit receiving as inputs the input datum and a second enabling signal and generating a pull-up control signal and a pull-down control signal either in phase or in phase opposition based upon whether the second enabling signal is active or disabled, the second enabling signal being a delayed replica of the first enabling signal;
- at least one pull-up driving circuit for driving said at least one pull-up transistor based upon the pull-up control signal and having first and second inputs, the first input of said pull-up driving circuit receiving an inverted pull-up control signal and the second input of said pull-up driving circuit receiving the pull-up slew-rate regulation signal, the second input of said pull-up driving circuit having a greater resistance than a resistance of the first input of said pull-up driving circuit; and
- at least one pull-down driving circuit for driving said at least one pull-down transistor based upon the pull-down control signal and having first and second inputs, the first input of said pull-down driving circuit receiving an inverted pull-down control signal and the second input of said pull-down driving circuit receiving the pull-down slew-rate regulation signal, the first input of said pull-down driving circuit having a greater resistance than a resistance of the second input of said pull-down driving circuit.

17. The output buffer of claim 16 wherein said at least one pull-up driving circuit comprises at least one NOR logic gate.

18. The output buffer of claim 16 wherein said at least one pull-down driving circuit comprises at least one NAND logic gate.

19. The output buffer of claim 16 wherein said slew rate regulation circuit produces the pull-up slew-rate regulation signal by ANDing the first enabling signal and the input datum.

20. The output buffer of claim 16 wherein said slew rate regulation circuit produces the pull-down slew-rate regulation signal by NANDing the first enabling signal and an inverted input datum.

21. The output buffer of claim 16 wherein said slew-rate regulation circuit further receives a mode selection signal for selecting between one of two different slew-rate values.

22. The output buffer of claim 21 wherein said slew-rate regulation circuit ANDs the first enabling signal, the input datum, and the mode selection signal to produce the pull-up slew rate regulation signal.

23. The output buffer of claim 22 wherein said slew-rate regulation circuit NANDs the first enabling input, an inverted input datum, and the mode selection signal to produce the pull-down slew-rate regulation signal.

24. The output buffer of claim 21 wherein the pull-up control signal comprises a first pull-up control signal; and wherein said output buffer further comprises a pull-up logic circuit for providing a second pull-up control signal as a delayed replica of the first pull-up control signal and a third pull-up control signal by ORing the first pull-up control signal and an inverted mode selection signal.

25. The output buffer of claim 24 wherein said at least one pull-up driving circuit comprises:
- a first pull-up driving circuit receiving the pull-up slew-rate regulation signal and the second pull-up control signal and producing a first pull-up driving signal; and
- a second pull-up driving circuit receiving the pull-up slew-rate regulation signal and the third pull-up control signal and producing a second pull-up driving signal.

26. The output buffer of claim 25 wherein said output stage comprises a pull-up stage controlled by the first and second pull-up driving signals.

27. The output buffer of claim 21 wherein the pull-down signal comprises a first pull-down control signal; and wherein said output buffer further comprises a pull-down logic circuit for providing a second pull-down control signal as a delayed replica of the first pull-down control signal and a third pull-down control signal by ANDing the first pull-down control signal and the mode selection signal.

28. The output buffer of claim 27 wherein said at least one pull-down driving circuit comprises:
- a first pull-down driving circuit receiving the pull-down slew-rate regulation signal and the second pull-down control signal and producing a first pull-down driving signal; and
- a second pull-down driving signal receiving the pull-down slew rate regulation signal and the third pull-down control signal and producing a second pull-down driving signal.

29. The output buffer of claim 28 wherein said output stage comprises a pull-down stage controlled by the first and second pull-down driving signals.

30. The output buffer according to claim 16 wherein said at least one pull-up driving circuit comprises:
- a cascade of an even number of inverters comprising an output inverter;
- an NMOS transistor connected between an output node of said at least one pull-up driving circuit and a reference voltage; and
- a PMOS transistor connecting said output inverter to a supply voltage, said PMOS transistor having a greater resistance than a resistance of said NMOS transistor, and both of said NMOS and PMOS transistors being controlled by the pull-up slew-rate regulation signal.

31. The output buffer according to claim 16 wherein said at least one pull-down driving circuit comprises:
- a cascade of an even number of inverters comprising an output inverter;
- a PMOS transistor connected between an output node of said at least one pull-down driving circuit and a supply voltage; and
- an NMOS transistor connecting said output inverter to a reference voltage, said NMOS transistor having a greater resistance than a resistance of said PMOS transistor, and both of said NMOS and PMOS transistors being controlled by said pull-down slew-rate regulation signal.

32. The output buffer of claim 16 wherein said enabling circuit produces the pull-up control signal by NANDing the second enabling signal and the input datum and produces the pull-down control signal by NORing an inverted second enabling signal and the input datum.

33. A method for providing an output datum having a predetermined voltage level and predetermined slew-rate using an output buffer comprising an output stage comprising at least one pull-up transistor and at least one pull-down transistor, the method comprising:

producing a pull-up slew rate regulation signal and a pull-down slew rate regulation signal based upon a first enabling signal and an input datum, the first enabling signal for causing the output buffer to operate in a normal state or a high impedance state;

generating a pull-up control signal and a pull-down control signal either in phase or in phase opposition based upon the input datum and upon the second enabling signal being active or disabled, the second enabling signal being a delayed replica of the first enabling signal;

driving the at least one pull-up transistor based upon the pull-up control signal using at least one pull-up driving circuit having first and second inputs, the first input of the pull-up driving circuit receiving an inverted pull-up control signal and the second input of the pull-up driving circuit receiving the pull-up slew-rate regulation signal, the second input of the pull-up driving circuit having a greater resistance than a resistance of the first input of the pull-up driving circuit; and driving the at least one pull-down transistor based upon the pull-down control signal using at least one pull-down driving circuit having first and second inputs, the first input of the pull-down driving circuit receiving an inverted pull-down control signal and the second input of the pull-down driving circuit receiving the pull-down slew-rate regulation signal, the first input of the pull-down driving circuit having a greater resistance than a resistance of the second input of the pull-down driving circuit.

34. The method of claim 33 wherein the at least one pull-up driving circuit comprises at least one NOR logic gate.

35. The method of claim 33 wherein the at least one pull-down driving circuit comprises at least one NAND logic gate.

36. The method of claim 33 wherein producing the pull-up slew-rate regulation signal comprises ANDing the first enabling signal and the input datum.

37. The method of claim 33 wherein producing the pull-down slew-rate regulation signal comprises NANDing the first enabling signal and an inverted input datum.

* * * * *